United States Patent [19]

Means et al.

[11] 3,971,960
[45] July 27, 1976

[54] FLIP-FLOP FALSE OUTPUT REJECTION CIRCUIT

[75] Inventors: Rodney J. Means; Gene A. Schriber, both of Tempe, Ariz.

[73] Assignee: Motorola, Inc., Chicago, Ill.

[22] Filed: Mar. 5, 1975

[21] Appl. No.: 555,470

[52] U.S. Cl. ............................ 328/206; 307/279; 307/289; 307/291; 328/195
[51] Int. Cl. .................... H03K 3/286; H03K 3/353
[58] Field of Search .................. 307/279, 289, 291; 328/195, 196, 206, 200

[56] References Cited
UNITED STATES PATENTS

| | | | |
|---|---|---|---|
| 3,278,758 | 10/1966 | Vroman | 328/195 X |
| 3,358,238 | 12/1967 | Shapiro et al. | 328/206 X |
| 3,603,815 | 9/1971 | Rao | 307/289 X |
| 3,757,231 | 9/1973 | Faustini | 307/DIG. 1 |
| 3,851,189 | 11/1974 | Moyer | 307/279 |
| 3,892,985 | 7/1975 | Kawagoe | 307/279 |

OTHER PUBLICATIONS

National Semiconductor Corp. publication; 10/1968; "MM483/MM583 JK Flip–Flops", 4 pages.

Primary Examiner—John S. Heyman
Assistant Examiner—L. N. Anagnos
Attorney, Agent, or Firm—Harry M. Weiss; Kenneth R. Stevens

[57] ABSTRACT

An asynchronously timed digital flip-flop circuit eliminates malfunction occurring when internal race conditions cause the flip-flop to lock up at the guasi-stable threshold state in which both input and output signals of the flip-flop are not at true logic levels but are equal to each other. The addition of special circuitry to reject these "false" outputs eliminates their propagation in the digital system in which said flip-flop is employed.

7 Claims, 3 Drawing Figures

FLIP-FLOP FALSE OUTPUT REJECTION CIRCUIT

BACKGROUND OF THE INVENTION

1. Field of the Invention

The invention of this application relates in general to digital logic circuitry and, in particular, to asynchronously timed digital flip-flops which incorporate special output circuits to reject false outputs.

2. Description of the Prior Art

In digital systems it is desirable to use bi-stable memory elements which change state in response to the application of a binary input signal. This type of element is called a flip-flop. A common elementary form of the flip-flop is the "set-reset" flip-flop in which a binary input signal applied to one input called the set input causes the flip-flop to assume the set state and a corresponding binary input signal applied to the reset input causes the flip-flop to assume the reset state.

Set-reset flip-flops are useful in many of the components of digital systems. They form the basic building blocks for more complex, notorial and sequential logic circuits such as counters, multiplexers, memories, shift registers, and others.

Logic circuitry commonly shows the set-reset flip-flop in an elementary form as a pair of coincident gates cross coupled so that the logic level at the output of one gate feeds back to the input of the other gate to latch the flip-flop in a stable state. Application of the appropriate input logic signal causes a change at a gate output and the cross coupling of this output back to the input of the other gate will cause the flip-flop to assume its other stable state. Thus the flip-flop can be set and reset. The elementary form of the set-reset flip-flop can consist of cross coupled NOR gates or cross coupled NAND gates. The choice of configuration depends on whether logic 1 or logic 0 is the active level of the input exitation of the flip-flop.

When flip-flops are used in logic designs which include the use of asynchronous timing signals, a troublesome problem can occur when the flip-flop assumes a quasi-stable state in which its outputs are at a logically indeterminant level between a logic 0 and a logic 1. This indeterminant level derives from the fact that the input to output transfer characteristic of any inverting type gate must include one particular point where the input and output levels are identically equal. It then follows that when coincident gates having transfer characteristics of this type are cross coupled to form a basic flip-flop element, it is possible to have an operating point where the inputs and the outputs of each of the cross coupled coincident gates will all be at a logically indeterminant level midway between the valid level for a logical 0 and the valid level for a logical 1. This logically indeterminant level is the threshold level of the gate. The problems associated with this indeterminant state are normally not encountered in timed logic systems because correct timing design insures that inputs to the set or reset cross coupled coincident gate flip-flop are of sufficient time duration to insure that inputs are forced to a valid logical 0 or logical 1 level. The problem emerges, however, in asynchronously timed systems in which the exact time duration of the input signals which will determine whether the coincident gate flip-flop gate is set or reset often cannot be predicted or controlled. As the detailed description which follows will show, asynchronous timing signals applied to a logic circuit which includes a cross coupled coincident gate flip-flop can result in a situation where one input signal which tends to force the flip-flop to the set state is in a "race" with another input signal which tends to have the opposing effect of maintaining the flip-flop in the reset state. When the degree of time asynchronism is slight, it is possible for the coincident gate flip-flop to assume the indeterminant state described above and thus generate a "false" output.

Another aspect of the problem associated with the generation of false outputs is that since all inverting coincident gates have similar transfer characteristics, it is possible for the logically indeterminant level midway between a valid logic 0 and a valid logic 1 to propagate through a series of interconnected gates in a logic system. This problem is accentuated in logic circuits implemented using monolithic integrated circuits because the characteristics of the devices forming coincident gates tend to closely match each other so that gate thresholds are essentially identical. Thus an input signal at the threshold level tends to produce an output signal at the threshold level which then creates a repetitive situation at the next gate in the sequential chain.

SUMMARY OF THE INVENTION

Accordingly, it is the object of this invention to provide an improved asynchronously timed digital flip-flop circuit in which false outputs are eliminated.

It is an additional object of this invention to provide an improved asynchronously timed digital flip-flop circuit which includes simple output buffer circuits which reject false outputs and thus prevent their propagation.

It is a further object of this invention to provide an improved asynchronously timed digital flip-flop circuit including a flip-flop false output rejection circuit which is readily implemented in integrated circuit form.

It is a further object of this invention to provide an improved asynchronously timed digital flip-flop including a flip-flop false output rejection circuit which can be implemented in integrated circuit form using MOS-FET technology.

It is a further object of this invention to provide an improved asynchronously timed digital flip-flop circuit including flip-flop false output rejection circuit whose simple configuration requires minimum chip area when implemented in integrated circuit form resulting in an integrated circuit which is more economical to manufacture.

In accordance with the aforementioned objects, the present invention provides a flip-flop false output rejection circuit for use in an asynchronously timed digital flip-flop wherein false output rejection is implemented by connecting the outputs of a cross couple coincident gate flip-flop to level sensitive buffer circuits. The input threshold levels of the buffer circuits are designed to respond only to inputs which are either greater or less than the logically indeterminant or false output produced by the cross couple coincident gate flip-flop. False outputs are thus rejected by the buffer circuit so that the outputs of the buffer circuits produce only valid logic 0 and valid logic 1 levels.

DETAILED DESCRIPTION OF THE INVENTION

Figure 1:
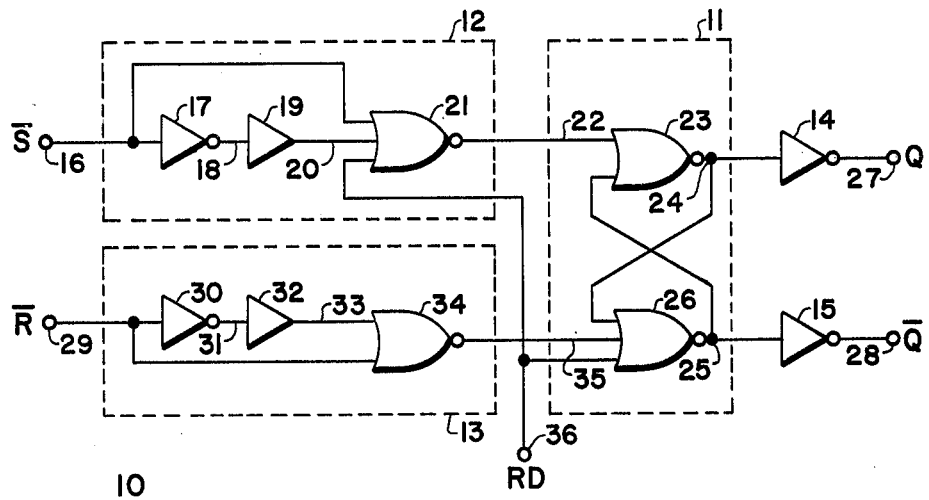
FIG. 1 is a logic diagram of an edge sensitive set-reset flip-flop including false output rejection circuits.

FIG. 1 shows the logic diagram 10 illustrating one embodiment of an asynchronously timed digital "flip-flop" utilizing false output rejection circuits. The circuit consists of a first input circuit means 12 and a second input circuit means 13 coupled to the inputs of a cross coupled coincident gate flip-flop 11 whose outputs are in turn coupled to flip-flop false output rejection circuits 14 and 15 respectively. The first input circuit means 12 consists of an input conductor 16 (the $\overline{S}$ input) which couples to an input of inverter 17 and to one input of three input NOR gate 21. The output of inverter 17 couples to an input of noninverting delay element 19 via conductor 18. The output of noninverting delay element 19 couples to another input of NOR gate 21 via conductor 20. The output of NOR gate 21 couples to an input of cross coupled coincident gate flip-flop 11 via conductor 22. The second input circuit means 13 consists of an input terminal 29 (the $\overline{R}$ input) which couples to the input of inverter 30 and to an input of two input NOR gate 34. The output of inverter 30 couples to an input of noninverting delay element 32 via conductor 31. The output of noninverting delay element 32 couples to another input of two input NOR gate 34 via conductor 33. The output of NOR gate 34 couples to an input of cross coupled coincident gate flip-flop 11 via conductor 35. Cross coupled coincident gate flip-flop 11 consists of NOR gates 23 and 26. The output of NOR gate 23 is conductor 24 which connects to an input of NOR gate 26 and connects to the input of inverter 14 which is a false output rejection circuit. The output of inverter 14 connects to conductor 27 to form the Q output of circuit 10. The output of NOR gate 26 connects to conductor 25 which connects to an input of NOR gate 23 and to an input of inverter 15 which is a false output rejection circuit. The output of inverter 15 connects to conductor 28 which forms the $\overline{Q}$ output of circuit 10. Circuit 10 also includes input conductor 36 (the RD input) which connects to an input of three input NOR gate 21 and to an input of three input NOR gate 26.

In FIG. 1 the cross coupled coincident gate flip-flop 11 together with the first input circuit means 12 and a second input circuit means 13 comprise an edge sensitive set-reset flip-flop which will change states only in response to a "negative" transition from a logic 1 to a logic 0 at input terminal 16 or 29. A detailed description of the operation of this type of flip-flop is provided in copending application Ser. No. 540,752 entitled, "Edge Sensitive Set-Reset Flip-Flop" filed Jan. 10, 1975 and assigned to the assignee of this application.

Figure 3:
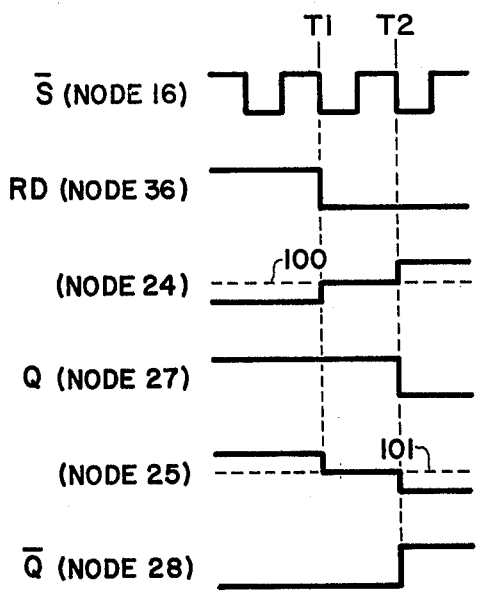
FIG. 3 is a timing device showing an asynchronous time coincidence resulting in false outputs and the resultant false output rejection.

In order to understand the operation of logic circuit 10 regarding flip-flop false output rejection, consider now the circuitry of FIG. 1 together with the timing diagram of FIG. 3. With the RD input (node 36) at a logical 1, the Q output (node 27) will be at a logical 0 and the $\overline{Q}$ output (node 28) will be at a logical 1. The logical 1 on the RD input blocks the effect of negative input transitions on the S input (node 16) by forcing the output of NOR gate 21 to a logical 0.

Now consider the asynchronous timing situation where the RD input can change from a logical 1 to a logical 0 level at a random time with respect to the input signal being applied to the $\overline{S}$ input at node 16. If the RD input goes to a logical 0 at approximately the same time as the negative transition of the input signal applied to the $\overline{S}$ input as is illustrated by the time $T_1$ in FIG. 2, the outputs 24 and 25 of the cross coupled coincident gate flip-flop may latch at a threshold state midway between the logical 0 state and the logical 1 state. This logically indeterminant "middle" or threshold state occurs because NOR gates 23 and 26 are both operating at a point on their respective transfer characteristics for which input levels and output levels are identically equal. The logic circuit of FIG. 1 eliminates this potential problem through use of the flip-flop false output rejection circuits provided by inverters 14 and 15. Inverter 14 has an input threshold higher than the logically indeterminate threshold state present at the output 24 of the cross coupled coincident gate flip-flop and which, therefore, does not respond to the undefined state at its input. Thus, the Q output at node 27 remains at a logic 1 level as shown in FIG. 3. Similarly, inverter 15 has an input threshold lower than the logically indeterminate threshold state produced at output node 25 of the cross coupled coincident gate flip-flop and which therefore, does not respond to the undefined state at its input. Thus, the $\overline{Q}$ output at node 28 remains at a logic 0 level as shown in FIG. 3.

Figure 2:
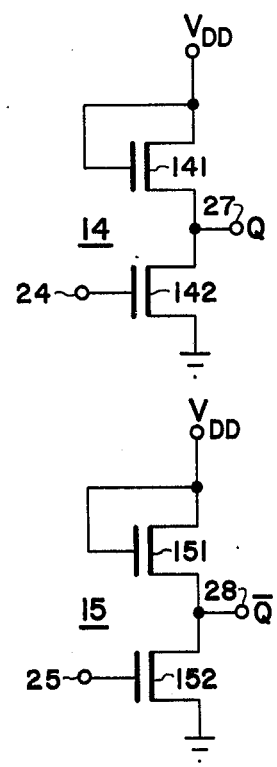
FIG. 2 is a schematic diagram showing the structure of the false output rejection circuits of FIG. 2.

FIG. 2 shows the flip-flop false output rejection inverters 14 and 15 in a schematic diagram form in which the logic elements are implemented using the MOSFET devices. (It should be noted that in the art the acronym is widely understood to include within the scope of its meaning all insulated gate and field effect transistors, and this is the intended meaning in the description herein of this invention. It should be recognized by those skilled in the art that a MOSFET may be of the P-channel type or the N-channel type. For the description of the operation of circuits presented herein, it is assumed that N-channel MOSFETs are used, however, P-channel MOSFETs may also be used. It is also well known that a MOSFET is a bilateral device having two main electrodes which may interchangeably function as source or drain electrodes, depending upon which is at the more positive voltage. The convention adopted for the description herein is that the main electrode will be identified as either a source or a drain, although it is understood that during circuit operation an electrode identified as the source may function as a drain part of the time).

In FIG. 2, conductor 24 couples to the gate of MOSFET 142 whose source electrode connects to ground and whose drain electrode connects to the source electrode of MOSFET 141 and to the output conductor 27 which is the Q output of logic circuit 10. The drain electrode of MOSFET 141 connects to the power supply $V_{DD}$ and is also connected to its own gate for self bias. Similarly, for inverter 15, conductor 25 couples to the gate of MOSFET 152 whose source electrode connects to ground and whose drain electrode couples to the source electrode of MOSFET 151 and to output conductor 28 which is the $\overline{Q}$ output of logic circuit 10. The drain electrode of MOSFET 151 connects to the $V_{DD}$ power supply and to its own gate for self bias.

For the particular embodiment of FIG. 1 and as further illustrated by the schematics of FIG. 2, the flip-flop false output rejection circuits are MOSFET inverters 14 and 15. The operation of these inverters is such that when an input signal which is greater than the gate threshold of the switching MOSFET is applied at the input, the switching device conducts pulling the output to a logic 0. As is well known in the prior art, the input threshold voltage of a MOSFET inverter can be changed by changing the channel width to channel length ratios (W/L ratio) of the devices used to form the MOSFET inverter. This technique is used in the particular embodiment of FIG. 1 in order to make the input threshold voltage of inverter 14 greater than the logically indeterminate output voltage present at the output of the cross coupled coincident gate flip-flop 11. Similarly, this technique is used to make the input threshold voltage of inverter 15 less than this same logically indeterminate level. The following Table I lists the relative device sizes and the resultant change in threshold voltage:

TABLE I

| INVERTER NUMBER | CHANGE IN INPUT THRESHOLD FROM NOMINAL | DEVICE RATIOS |
| --- | --- | --- |
| 14 | +120 MV | Device 141 W/L=.4/.6 |
|  |  | Device 142 W/L=1/.25 |
| 15 | −120 MV | Device 151 W/L=.4/1.7 |
|  |  | Device 152 W/L=1/.25 |

While this invention has been shown in connection with a specific logic circuit embodiment, it should be apparent to persons skilled in the art that various changes in form and arrangement in parts may be made to suit various requirements without departing from the spirit and scope of the present invention.

What is claimed is:

1. A digital logic circuit comprising:
   a. storage means having a first storage state and a second storage state for storing digital information;
   b. first input means coupled to said storage means and adapted to respond to a first input signal for causing said storage means to assume said first storage stage;
   c. second input means coupled to said storage means and adapted to respond to a second input signal for causing said storage means to assume said second storage state; and
   d. false output rejection circuit means coupled to the output of said storage means for generating a corrected replica of said first storage state when time asynchronism between said first input signal and said second input signal cause said storage means to assume a logically indeterminate state.

2. The circuit recited in claim 1 wherein said storage means is a cross-coupled coincident gate flip-flop.

3. The circuit recited in claim 2 wherein said first input means includes coincident gates.

4. The circuit recited in claim 3 wherein said false output rejection circuit means further comprises threshold detection circuits.

5. The circuit recited in claim 4 wherein said coincidence gates are NOR gates.

6. The circuit recited in claim 5 wherein said coincidence gates are made up of MOSFET devices.

7. The circuit recited in claim 6 wherein said threshold detection circuits are MOSFET inverters.

* * * * *